United States Patent
Cheng et al.

(10) Patent No.: US 10,234,737 B2
(45) Date of Patent: Mar. 19, 2019

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Hongfei Cheng, Beijing (CN); Jianbo Xian, Beijing (CN); Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/912,224

(22) PCT Filed: Sep. 17, 2015

(86) PCT No.: PCT/CN2015/089834
§ 371 (c)(1),
(2) Date: Feb. 16, 2016

(87) PCT Pub. No.: WO2016/141705
PCT Pub. Date: Sep. 15, 2016

(65) Prior Publication Data
US 2017/0045791 A1     Feb. 16, 2017

(30) Foreign Application Priority Data

Mar. 11, 2015 (CN) .......................... 2015 1 0106509

(51) Int. Cl.
*H01L 29/10*  (2006.01)
*G02F 1/1362*  (2006.01)
(Continued)

(52) U.S. Cl.
CPC ...... *G02F 1/136286* (2013.01); *G02F 1/1368* (2013.01); *G02F 1/134309* (2013.01);
(Continued)

(58) Field of Classification Search
None
See application file for complete search history.

(56) References Cited

U.S. PATENT DOCUMENTS 4,968,119 A * 11/1990 Stewart ................. G02F 1/1368
349/43
5,535,028 A   7/1996 Bae et al.
(Continued)

FOREIGN PATENT DOCUMENTS

CN   100354729 C   12/2007
CN   103777415 A   5/2014

OTHER PUBLICATIONS

First office Action dated Feb. 4, 2017 in corresponding Chinese Application No. 201510106509.9.

*Primary Examiner* — Nishath Yasmeen
(74) *Attorney, Agent, or Firm* — Nath, Goldberg & Meyer; Joshua B. Goldberg; Stanley N. Protigal

(57) ABSTRACT

A gas purge valve comprising a housing formed with a fluid inlet and a fluid outlet, said fluid outlet bounded by a kinetic valve seating, and a sealing assembly comprising a float member coaxially displaceable within the housing, and a sealing cap coupled to said float member; the sealing cap being axially displaceable with respect to the float member between a first position in which it conjoins the float, and a second position in which it departs from the float; said sealing cap formed at an outside face thereof with a kinetic seal fitted for sealing engagement of the kinetic valve seating, and an automatic valve aperture formed in the sealing cap and bounded by an automatic valve seating; and an automatic sealing member articulated at an upper end of the float member for sealing engagement of the automatic valve seating.

19 Claims, 4 Drawing Sheets

(51) Int. Cl.
   *H01L 27/12*   (2006.01)
   *G02F 1/1343*   (2006.01)
   *G02F 1/1368*   (2006.01)
   *G02F 1/1337*   (2006.01)
   *H01L 29/423*   (2006.01)

(52) U.S. Cl.
   CPC ........ *G02F 1/134363* (2013.01); *H01L 27/12* (2013.01); *G02F 1/133784* (2013.01); *G02F 2001/134318* (2013.01); *G02F 2001/136295* (2013.01); *G02F 2201/40* (2013.01); *H01L 29/42384* (2013.01)

(56) References Cited

U.S. PATENT DOCUMENTS

| | | | |
|---|---|---|---|
| 5,897,182 A * | 4/1999 | Miyawaki | G02F 1/136286 345/93 |
| 6,791,647 B1 * | 9/2004 | Kim | G02F 1/136213 349/110 |
| 7,433,006 B2 * | 10/2008 | Hung | G02F 1/136213 349/141 |
| 2002/0084459 A1 * | 7/2002 | Choi | G02F 1/1368 257/72 |
| 2005/0083466 A1 | 4/2005 | Lee et al. | |
| 2005/0140893 A1 * | 6/2005 | Hong | G02F 1/134336 349/139 |
| 2006/0001813 A1 | 1/2006 | Ham et al. | |
| 2012/0153287 A1 | 6/2012 | Park et al. | |
| 2014/0111719 A1 | 4/2014 | Sekine | |

\* cited by examiner

ARRAY SUBSTRATE AND MANUFACTURING METHOD THEREOF, AND DISPLAY DEVICE

This is a National Phase Application filed under 35 U.S.C. 371 as a national stage of PCT/CN2015/089834 filed on Sep. 17, 2015, an application claiming the benefit of Chinese Application No. 201510106509.9 filed on Mar. 11, 2015, the content of each of which is hereby incorporated by reference in its entirety.

FIELD OF THE INVENTION

The present invention belongs to the field of display technology, and particularly relates to an array substrate and a manufacturing method thereof, and a display device.

BACKGROUND OF THE INVENTION

Liquid crystal display technology is widely used in televisions, mobile phones, and public information display. Liquid crystal display modes can be classified into a twisted nematic (TN) mode, a vertical aligned (VA) mode and a horizontal electrical field mode. The horizontal electric field mode includes an in-plane switching (IPS) mode and a fringe field switching (FFS) mode. The liquid crystal display panel in the TN or horizontal electrical field mode, except the VA mode, needs a rubbing process to give liquid crystal molecules an initial arrangement direction. An optimized viewing direction of the liquid crystal display panel is closely related to rubbing direction.

As for the FFS mode, the liquid crystal display panel includes an array substrate and a color filter substrate, the array substrate includes gate lines, data lines and pixel units, the gate lines and the data lines intersect perpendicularly, adjacent gate lines and adjacent data lines define pixel units, and each pixel unit includes a thin film transistor, a pixel electrode and a common electrode; the common electrode is located above the pixel electrode and has slits formed therein, an insulation layer is provided between the pixel electrode and the common electrode, a data voltage on the data line is written into the pixel electrode through the thin film transistor, and the entire common electrode covers all of the pixel units. The FFS mode liquid crystal display panel needs a rubbing process to give liquid crystal molecules an initial arrangement direction. In the FFS mode in the prior art, the rubbing direction and extending direction of the data lines have an included angle of about 7° therebetween. Since the data lines and the gate lines are arranged to intersect perpendicularly, an optimized viewing direction cannot be obtained when viewing the display panel in the extending direction of the data lines.

SUMMARY OF THE INVENTION

In view of the above problem existing in the array substrate of the prior art, the present invention provides an array substrate with optimized viewing angle, large aperture ratio and high display quality and a manufacturing method thereof, and a display device having the array substrate.

The present invention provides an array substrate, comprising a plurality of gate lines and a plurality of data lines arranged to intersect each other, and pixel units defined by adjacent gate lines and adjacent data lines, each pixel unit comprises a thin film transistor and a pixel electrode, each data line comprises a plurality of data line segments, each of which corresponds to one pixel unit, and two adjacent data line segments of the same data line are connected through a connection portion; an included angle between extending direction of the gate line and extending direction of the data line segment is $\alpha$, where $60°\leq\alpha\leq87°$; a gate of the thin film transistor is a protrusive structure of the gate line, and an included angle between extending direction of a side edge of the protrusive structure close to the pixel electrode and the extending direction of the gate line is $\beta$, where $20°\leq\beta\leq70°$.

Preferably, $70°\leq\alpha\leq85°$ and $30°\leq\beta\leq50°$.

Preferably, the pixel electrode is a plate-like electrode, which comprises a first side, a second side, a third side, a fourth side and a fifth side; the first side and the second side are parallel to the extending direction of the gate line; the third side and the fourth side are parallel to the extending direction of the data line segment; and the fifth side is parallel to extending direction of a side edge of the protrusive structure close to the pixel electrode.

Preferably, the array substrate further comprises a common electrode, which is provided above and insulated from the pixel electrode; the common electrode is provided with slits whose extending direction is parallel to the extending direction of the data line segment.

Preferably, a source of the thin film transistor is the connection portion, or a part of the connection portion.

Preferably, the extending directions of the data line segments, corresponding to different pixel units, of the same data line are parallel to each other.

Preferably, the connection portion is in the shape of curve segment.

Preferably, the other side edge of the protrusive structure of the gate line is located at an outer side of the pixel unit in which the thin film transistor with said protrusive structure as its gate is provided.

Preferably, a top edge of the protrusive structure of the gate line overlaps the data line segment corresponding to the pixel unit in which the thin film transistor with said protrusive structure as its gate is provided.

Preferably, a drain of the thin film transistor and the pixel electrode are connected through a via in a passivation layer, or lapped directly.

The present invention further provides a display device, comprising an array substrate and an opposite substrate assembled with the array substrate in an aligned manner, and the array substrate is the above-described array substrate.

The present invention further provides a manufacturing method of an array substrate, comprising the following steps of:

S1: forming gates of thin film transistors, gate lines and common electrode lines on a substrate, such that each gate is a protrusive structure of the gate line;

S2: forming a gate insulation layer on the substrate subjected to step S1;

S3: forming an active layer of the thin film transistor on the substrate subjected to step S2;

S4: forming a source and a drain of the thin film transistor, and data lines on the substrate subjected to step S3, such that an included angle between extending direction of the gate line and extending direction of the data line is $\alpha$, where $60°\leq\alpha\leq87°$;

S5: forming a passivation layer on the substrate subjected to step S4, and forming a via penetrating through the passivation layer above the drain of the thin film transistor; and S6: forming a pixel electrode on the substrate subjected to step S5, such that the pixel electrode is connected to the drain through the via, and an included angle between extending direction of a side edge of the protrusive structure close to the pixel electrode and the extending direction of the gate line is β, where 20°≤β≤70°.

Preferably, in the manufacturing method, 70°≤α≤85° and 30°≤β≤50°.

The present invention further provides another manufacturing method of an array substrate, comprising the following steps of:

A1: forming gates of thin film transistors, gate lines and common electrode lines on a substrate, such that each gate is a protrusive structure of the gate line;

A2: forming a gate insulation layer on the substrate subjected to step A1;

A3: forming a pixel electrode on the substrate subjected to step A2, such that an included angle between extending direction of a side edge of the protrusive structure close to the pixel electrode and extending direction of the gate line is β, where 20°≤β≤70°

A4: forming an active layer of the thin film transistor on the substrate subjected to step A3;

A5: forming a source and a drain of the thin film transistor, and data lines on the substrate subjected to step A4, such that the drain and the pixel electrode are lapped directly and an included angle between the extending direction of the gate line and extending direction of the data line is α, where 60°≤α≤87°;

A6: forming a passivation layer on the substrate subjected to step A5; and

A7: forming a common electrode on the substrate subjected to step A6, such that the common electrode is provided above and insulated from the pixel electrode, and the common electrode is provided with slits, whose extending direction is parallel to the extending direction of the data line.

Preferably, in the manufacturing method, 75°≤α≤85° and 30°≤β≤50°.

The present invention has the following beneficial effects:

in the array substrate provided by the present invention, each data line includes a plurality of data line segments, each of which corresponds to one pixel unit, and two adjacent data line segments of the same data line are connected through a connection portion; the included angle between the extending direction of the gate line and the extending direction of the data line segment is α, where 60°≤α≤87°; the gate of the thin film transistor is a protrusive structure of the gate line, and the included angle between the extending direction of the side edge of the protrusive structure close to the pixel electrode and the extending direction of the gate line is β, where 20°≤β≤70°. In the present invention, the gate lines are arranged not to be perpendicular to the data lines so as to adapt to the rubbing direction of the display panel, so that the array substrate can have an optimized viewing direction, a large aperture ratio and a good display quality, when viewing the display panel in the extending direction of the data line.

NUMERAL REFERENCES

1: substrate;
Gi: the i-th row of gate line; Gi+1: the (i+1)-th row of gate line; Gi−1: the (i−1)-th row of gate line;
Dj−1: the (j−1)-th column of data line; Dj: the j-th column of data line; Dj+1: the (j+1)-th column of data line;
CLi−1: the (i−1)-th row of common electrode line; CLi: the i-th row of common electrode line; CLi+1: the (i+1)-th row of common electrode line;
15: gate insulation layer;
25: passivation layer;
10: protrusive structure of a gate line; 10a: one side edge of the protrusive structure of a gate line; 10b: the other side edge of the protrusive structure of a gate line; 10c: top edge of the protrusive structure of a gate line;
20: active layer;
30: data line segment; 31: source; 32 drain;
30a: connection portion;
40: passivation layer via;
50: pixel electrode; 50a: first side; 50b: second side; 50c: third side; 50d: fourth side; 50e: fifth side;
60: common electrode; 60a: slit.

DETAILED DESCRIPTION OF THE EMBODIMENTS

To enable those skilled in the art to better understand the technical solutions of the present invention, the present invention will be further described in detail below in conjunction with the accompanying drawings and the specific implementations.

First Embodiment

As shown in FIGS. 1 to 4, this embodiment provides an array substrate, which includes a plurality of gate lines (e.g., Gi−1, Gi, Gi+1) and a plurality of data lines (e.g., Dj−1, Dj, Dj+1), arranged to intersect each other, and pixel units defined by adjacent gate lines and adjacent data lines. Each data line includes a plurality of data line segments 30, each of which corresponds to one pixel unit, and two adjacent data line segments 30 of the same data line are connected through a connection portion 30a; an included angle between extending direction of the gate line and extending direction of the data line segment 30 is α, where 60°≤α≤87°; a gate of a thin film transistor is a protrusive structure 10 of the gate line, and an included angle between extending direction of a side edge of the protrusive structure 10 close to the pixel electrode and the extending direction of the gate line is β, where 20°≤β≤70°.

Since the included angle between the extending direction of the gate line and the extending direction of the data line segment 30 in the array substrate of this embodiment is α, where 60°≤α≥87°, and the included angle between the extending direction of a side edge of the protrusive structure close to the pixel electrode and the extending direction of the gate line is β, where 20°≤β≤70°, the array substrate can have an optimized viewing direction, a large aperture ratio and a good display quality.

The array substrate provided by this embodiment can be applied in a TN mode display device.

Figure 1:
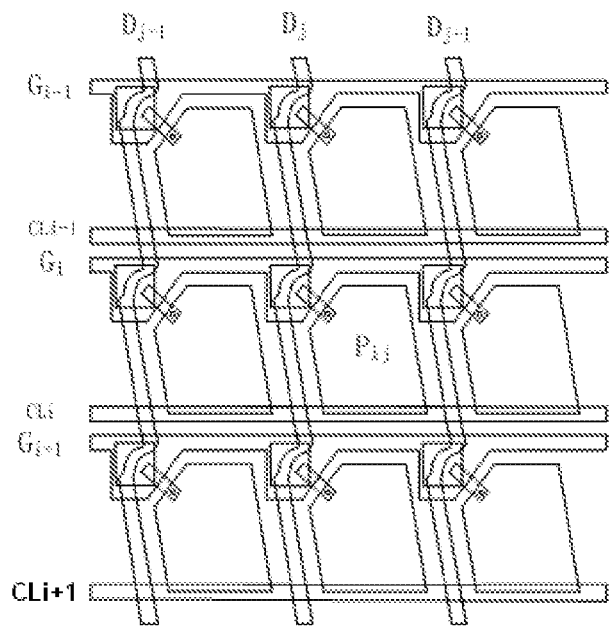
FIG. 1 is a schematic diagram of an array substrate in a first embodiment of the present invention.
Figure 2:
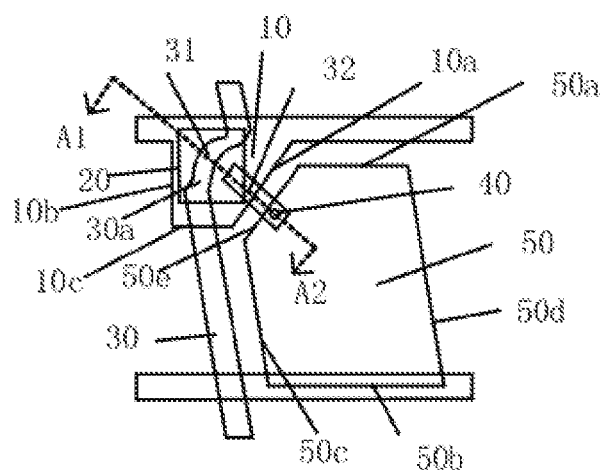
FIG. 2 is a schematic diagram of one pixel unit in FIG. 1.
Figure 3:
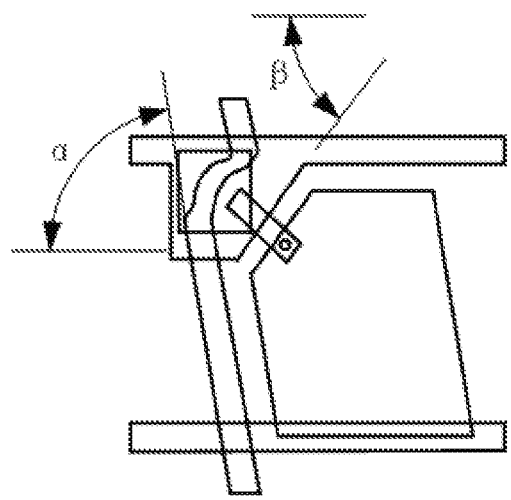
FIG. 3 is a schematic diagram of included angles α and β in the first embodiment of the present invention.

Specifically, as shown in FIGS. 2 and 3, a pixel unit Pij defined by the i-th row of gate line Gi, the (i+1)-th row of gate line Gi+1, the j-th column of data line Dj and the (j+1)-th column of data line Dj+1 is taken as an example. Here, a common electrode line CLi is parallel to the gate line Gi. The pixel unit Pij includes a thin film transistor, a pixel electrode 50 and a data line segment 30 corresponding to the pixel electrode 50. The included angle between the extending direction of the data line segment 30 and the extending direction of the gate line Gi is α. The gate of the thin film transistor is the protrusive structure 10 of the gate line Gi, and the included angle between the extending direction of one side edge 10a of the protrusive structure 10 close to the pixel electrode 50 and the extending direction of the gate line Gi is β.

Here, $60°≤α≤87°$, and $20°≤β≤70°$. Further preferably, $70°≤α≤85°$ and $30°≤β≤50°$.

The pixel electrode 50 of this embodiment is a plate-like electrode, which includes a first side 50a, a second side 50b, a third side 50c, a fourth side 50d and a fifth side 50e. The first side 50a and the second side 50b are parallel to the extending direction of the gate line Gi; the third side 50c and the fourth side 50d are parallel to the extending direction of the data line segment 30; the fifth side 50e is parallel to the extending direction of the side edge 10a of the protrusive structure 10 close to the pixel electrode 50. The other side edge 10b of the protrusive structure 10 of the gate line is located at an outer side of the pixel unit in which the thin film transistor with said protrusive structure 10 as its gate is provided. The top edge 10c of the protrusive structure 10 of the gate line overlaps the data line segment corresponding to the pixel unit in which the thin film transistor with said protrusive structure as its gate is provided. In this case, not only can a large aperture ratio of the array substrate be ensured, but the space of the pixel region is also fully used.

Figure 4:
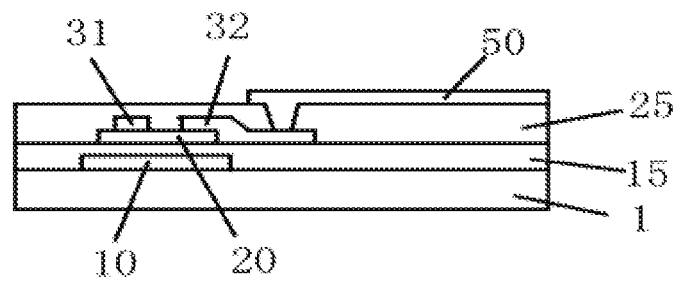
FIG. 4 is a sectional view, taken along a direction of A1-A2, of the pixel unit in FIG. 2.

As shown in FIGS. 2 and 4, a passivation layer 25 is provided between a layer in which a source 31 and a drain 32 of the thin film transistor are provided and a layer in which the pixel electrode 50 is provided, and the pixel electrode 50 is connected to the drain 32 of the thin film transistor through a via 40 penetrating through the passivation layer 25. The source 31 of the thin film transistor is the connection portion 30a of the data line Dj, or a part of the connection portion 30a. Particularly, the connection portion 30a of the data line Dj in this embodiment is in the shape of curve segment. It should be noted that, the pixel electrode 50 may also be disposed on the gate insulation layer 15, and the pixel electrode 50 and the drain 32 of the thin film transistor may be connected in a directly lapped manner.

In this embodiment, the extending directions of the data line segments 30, corresponding to different pixel units, of the same data line are parallel to each other.

Accordingly, with respect to the above array substrate, the present embodiment further provides a manufacturing method of array substrate, which includes the following steps 1 to 6.

At step 1, a layer of gate metal layer film is deposited on a substrate 1 by sputtering, and patterns of the gates of the thin film transistors, the gate lines and the common electrode lines are formed by patterning process, such that each gate is the protrusive structure of the gate line.

It should be noted that, the substrate 1 may refer to not only a substrate without any film layer formed thereon, such as white glass, but also a substrate with other film layer or pattern formed thereon, such as a substrate with a buffer layer formed thereon. The patterning process generally includes coating photoresist, exposing, developing, etching, stripping off the photoresist, and the like.

The gate metal layer film may be a single layered structure or a multi-layered composite laminate structure formed from one or more materials selected from molybdenum (Mo), molybdenum and niobium alloy (MoNb), aluminum (Al), aluminum and neodymium alloy (AlNd), titanium (Ti) and copper (Cu), and is preferably a single layered structure or a multi-layered composite laminate structure formed from Mo, Al, or an alloy containing Mo and Al.

At step 2, on the substrate 1 subjected to the above step, a gate insulation layer 15 is formed by a manufacturing method such as chemical vapor deposition, plasma-assisted chemical vapor deposition, sputtering, or the like.

The gate insulation layer 15 may be a multi-layered composite film formed from one or two materials selected from silicon oxide (SiOx), silicon nitride (SiNx), hafnium oxide (HfOx), silicon oxynitride (SiON), aluminum oxide (AlOx), and the like.

At step 3, on the substrate 1 subjected to the above steps, an active layer film of each thin film transistor is deposited by a manufacturing method such as chemical vapor deposition, plasma-assisted chemical vapor deposition, sputtering, or the like, and a pattern of an active layer 20 of the thin film transistor is formed by patterning process.

The material of the active layer 20 may be amorphous silicon, polycrystalline silicon, microcrystalline silicon or oxide semiconductor.

At step 4, on the substrate 1 subjected to the above steps, a source-drain metal layer film is formed by sputtering, and patterns of the source 31 and the drain 32 of each thin film transistor, and data lines are formed by patterning process, such that the included angle between the extending direction of the gate line and the extending direction of the data line is α, where $60°≤α≤87°$.

The material of the source-drain metal layer film may be one or more materials of molybdenum (Mo), molybdenum and niobium alloy (MoNb), aluminum (Al), aluminum and neodymium alloy (AlNd), titanium (Ti) and copper (Cu), and is preferably Mo, Al, or an alloy containing Mo and Al.

At step 5, on the substrate 1 subjected to the above steps, a passivation layer 25 may be formed by a manufacturing method such as chemical vapor deposition, plasma-assisted chemical vapor deposition, sputtering, or the like, and a via 40 penetrating through the passivation layer 25 above the drain of the thin film transistor is formed.

The passivation layer may be a multi-layered composite film formed from one or two materials selected from silicon oxide (SiOx), silicon nitride (SiNx), hafnium oxide (HfOx), silicon oxynitride (SiON), aluminum oxide (AlOx), and the like.

At step 6, on the substrate 1 subjected to the above steps, a transparent conductive metal oxide film is deposited by sputtering. Then, a pattern of the pixel electrode 50 is formed by patterning process, such that the pixel electrode 50 is connected to the drain 32 through the via 40 in the passivation layer 25, and the included angle between the extending direction of the side edge of the protrusive structure close to the pixel electrode 50 and the extending direction of the gate line is β, where $20°≤β≤70°$.

The material of the transparent conductive metal oxide film is ITO (indium tin oxide), IZO (indium zinc oxide), IGZO (indium gallium zinc oxide) or InGaSnO (indium gallium tin oxide).

So far, the manufacturing of the array substrate is completed.

Second Embodiment

Figure 5:
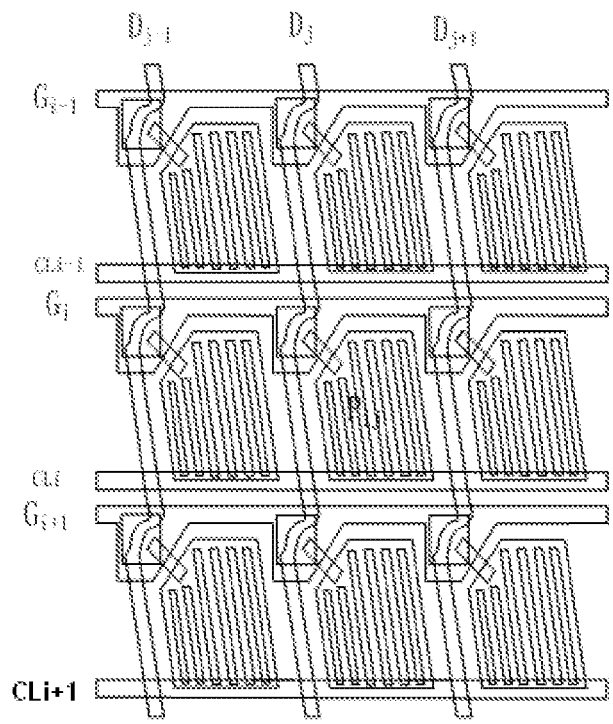
FIG. 5 is a schematic diagram of an array substrate in a second embodiment of the present invention.
Figure 6:
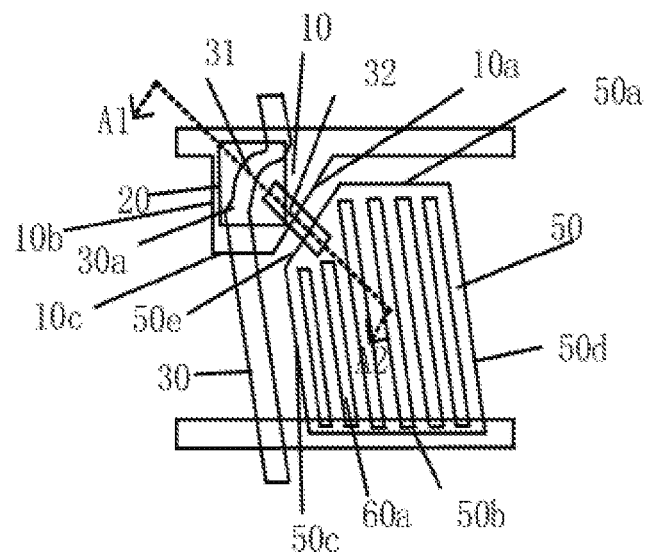
FIG. 6 is a schematic diagram of one pixel unit in FIG. 5.
Figure 7:
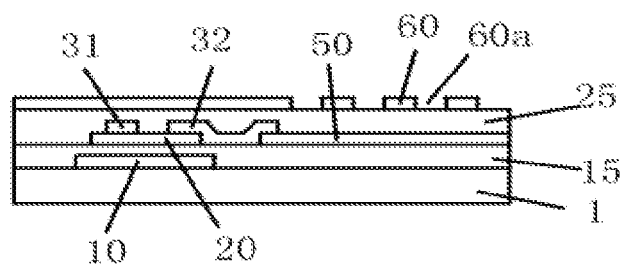
FIG. 7 is a sectional view, taken along a direction of A1-A2, of the pixel unit in FIG. 6.

As shown in FIGS. 5 to 7, this embodiment provides an array substrate, which includes a plurality of gate lines (e.g., Gi−1, Gi, Gi+1) and a plurality of data lines (e.g., Dj−1, Dj, Dj+1), arranged to intersect each other, and pixel units defined by adjacent gate lines and adjacent data lines. Each data line includes a plurality of data line segments 30, each of which corresponds to one pixel unit, and two adjacent data line segments 30 of the same data line are connected through a connection portion 30a; an included angle between extending direction of the gate line and extending direction of the data line segment 30 is α, where 60°≤α≤87°; a gate of a thin film transistor is a protrusive structure 10 of the gate line, and an included angle between extending direction of a side edge of the protrusive structure close to the pixel electrode and extending direction of the gate line is β, where 20°≤β≤70°.

Since the included angle between the extending direction of the gate line and the extending direction of the data line segment 30 in the array substrate of this embodiment is α, where 60°≤α≤87°, and the included angle between the extending direction of a side edge of the protrusive structure close to the pixel electrode and the extending direction of the gate line is β, where 20°≤β≤70°, the array substrate can have an optimized viewing direction, a large aperture ratio and a good display quality.

The array substrate provided by this embodiment can be applied in a FFS mode display device.

Specifically, as shown in FIGS. 5 and 6, a pixel unit Pij defined by the i-th row of gate line Gi, the (i+1)-th row of gate line Gi+1, the j-th column of data line Dj and the (j+1)-th column of data line Dj+1 is taken as an example. Here, a common electrode line CLi is parallel to the gate line Gi. The pixel unit Pij includes a thin film transistor, a pixel electrode 50 and a data line segment 30 corresponding to the pixel electrode. An included angle between extending direction of the data line segment 30 and extending direction of the gate line Gi is α. A gate of the thin film transistor is the protrusive structure 10 of the gate line Gi, and an included angle between extending direction of one side edge 10a of the protrusive structure 10 close to the pixel electrode 50 and extending direction of the gate line Gi is β.

Here, 60°≤α≤87°, and 20°≤β≤70°. Further preferably, 70°≤α≤85° and 30°≤β≤50°.

The pixel electrode 50 of this embodiment is a plate-like electrode, which includes a first side 50a, a second side 50b, a third side 50c, a fourth side 50d and a fifth side 50e. The first side 50a and the second side 50b are parallel to the extending direction of the gate line Gi; the third side 50c and the fourth side 50d are parallel to the extending direction of the data line segment 30; the fifth side 50e is parallel to the extending direction of the side edge 10a of the protrusive structure 10 close to the pixel electrode 50. The other side edge 10b of the protrusive structure 10 of the gate line is located at an outer side of the pixel unit in which the thin film transistor with said protrusive structure 10 as its gate is provided. A top edge 10c of the protrusive structure 10 of the gate line overlaps the data line segment corresponding to the pixel unit in which the thin film transistor with said protrusive structure 10 as its gate is provided. In this case, not only can a large aperture ratio of the array substrate be ensured, but the space of the pixel region is also fully used.

As shown in FIG. 7, the pixel electrode 50 and a drain 32 of the thin film transistor are connected in a directly lapped manner. A source 31 of the thin film transistor is the connection portion 30a of the data line Dj, or a part of the connection portion 30a. Particularly, the connection portion 30a of the data line Dj in this embodiment is in the shape of curve segment.

In this embodiment, the extending directions of the data line segments 30, corresponding to different pixel units, of the same data line are parallel to each other.

The array substrate further includes a common electrode 60, which is provided above and insulated from the pixel electrode 50; the common electrode 60 is provided with slits 60a whose extending direction is parallel to the extending direction of the data line segment 30. It should be noted that, the extending direction of the slit 60a should be construed as the extending direction of an intermediate line of the slit body, the slit body excludes two end portions of the slit 60a, and the shape of the end portions of the slit 60a may be slightly different from that of the body part of the slit, so as to better control the arrangement of liquid crystal molecules.

Accordingly, with respect to the above array substrate, the present embodiment further provides a manufacturing method of array substrate, which includes the following steps 1 to 7.

At step 1, a layer of gate metal layer film is deposited on a substrate 1 by sputtering, and patterns including the gates of the thin film transistors, the gate lines and the common electrode lines are formed by patterning process, such that each gate is the protrusive structure of the gate line.

It should be noted that, the substrate 1 may refer to not only a substrate without any film layer formed thereon, such as white glass, but also a substrate with other film layer or pattern formed thereon, such as a substrate with a buffer layer formed thereon. The patterning process generally includes coating photoresist, exposing, developing, etching, stripping off the photoresist, and the like.

The gate metal layer film may be a single layered structure or a multi-layered composite laminate structure formed from one or more materials selected from molybdenum (Mo), molybdenum and niobium alloy (MoNb), aluminum (Al), aluminum and neodymium alloy (AlNd), titanium (Ti) and copper (Cu), and is preferably a single layered structure or a multi-layered composite laminate structure formed from Mo, Al, or an alloy containing Mo and Al.

At step 2, on the substrate 1 subjected to the above step, a gate insulation layer 15 is formed by a manufacturing method such as chemical vapor deposition, plasma-assisted chemical vapor deposition, sputtering, or the like.

The gate insulation layer 15 may be a multi-layered composite film formed from one or two materials selected from silicon oxide (SiOx), silicon nitride (SiNx), hafnium oxide (HfOx), silicon oxynitride (SiON), aluminum oxide (AlOx), and the like.

At step 3, on the substrate 1 subjected to the above steps, a transparent conductive metal oxide film is deposited by sputtering. Then, a pattern of the pixel electrode 50 is formed by patterning process, such that the included angle between the extending direction of the side edge of the protrusive structure close to the pixel electrode 50 and the extending direction of the gate line is β, where 20°≤β≤70°.

The material of the transparent conductive metal oxide film is ITO (indium tin oxide), IZO (indium zinc oxide), IGZO (indium gallium zinc oxide) or InGaSnO (indium gallium tin oxide).

At step 4, on the substrate 1 subjected to the above steps, an active layer film of each thin film transistor is deposited by a manufacturing method such as chemical vapor deposition, plasma-assisted chemical vapor deposition, sputtering, or the like, and a pattern of an active layer of the thin film transistor is formed by patterning process.

The material of the active layer 20 may be amorphous silicon, polycrystalline silicon, microcrystalline silicon or oxide semiconductor.

At step 5, on the substrate 1 subjected to the above steps, a source-drain metal layer film is formed by sputtering, and patterns of the source 31 and the drain 32 of each thin film transistor, and data lines are formed by patterning process, such that the drain 32 of the thin film transistor and the pixel electrode are lapped directly and the included angle between the extending direction of the gate line and the extending direction of the data line is α, where $60°≤α≤87°$.

The material of the source-drain metal layer film may be one or more materials of molybdenum (Mo), molybdenum and niobium alloy (MoNb), aluminum (Al), aluminum and neodymium alloy (AlNd), titanium (Ti) and copper (Cu), and is preferably Mo, Al, or an alloy containing Mo and Al.

At step 6, on the substrate 1 subjected to the above steps, a passivation layer 25 may be formed by a manufacturing method such as chemical vapor deposition, plasma-assisted chemical vapor deposition, sputtering, or the like.

The passivation layer may be a multi-layered composite film formed from one or two materials selected from silicon oxide (SiOx), silicon nitride (SiNx), hafnium oxide (HfOx), silicon oxynitride (SiON), aluminum oxide (AlOx), and the like.

At step 7, on the substrate 1 subjected to the above steps, a transparent conductive metal oxide film is deposited by sputtering. Then, a pattern of the common electrode 60 is formed by patterning process, such that the common electrode 60 is provided above and insulated from the pixel electrode 50, and is provided with slits, whose extending direction is parallel to the extending direction of the data line.

The material of the transparent conductive metal oxide film is ITO (indium tin oxide), IZO (indium zinc oxide), IGZO (indium gallium zinc oxide) or InGaSnO (indium gallium tin oxide).

So far, the manufacturing of the array substrate is completed.

Third Embodiment

This embodiment provides a display device, which includes the above-described array substrate and an opposite substrate assembled with the array substrate in an aligned manner. When the array substrate is the array substrate according to the first embodiment, the display device is a TN mode display device, and in this case, a common electrode is further provided on the opposite substrate. When the array substrate is the array substrate according to the second embodiment, the display device is a FFS mode display device The display device may be a liquid crystal display device or an electroluminescent display device, for example, any product or component with a display function, such as a liquid crystal panel, electronic paper, a mobile phone, a tablet computer, a television, a display, a notebook computer, a digital photo frame, a navigator or the like.

The display device in this embodiment has an optimized viewing direction, a large aperture ratio and a good display quality.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. An array substrate, comprising a plurality of gate lines and a plurality of data lines arranged to intersect each other, and pixel units defined by adjacent gate lines and adjacent data lines, each pixel unit comprising a thin film transistor and a pixel electrode, wherein, each data line comprises a plurality of data line segments, each of which corresponds to one pixel unit, and two adjacent data line segments of the same data line are connected through a connection portion; an included angle between extending direction of the gate line and extending direction of the data line segment is a, where $60°<a<87°$; a gate of the thin film transistor is a protrusive structure of the gate line, and an included angle between extending direction of a side edge of the protrusive structure close to the pixel electrode and the extending direction of the gate line is p, where $20°<P<70°$; wherein, for each pixel unit, in a plan view, an outer side edge of the protrusive structure of the gate line is located at a side of the data line opposite to the pixel electrode and the connection portion is located within the protrusive structure and wherein, the pixel electrode is a plate-like electrode, which in a plan view comprises a first side, a second side, a third side, a fourth side and a fifth side; the first side and the second side are parallel to the extending direction of the gate line; the third side and the fourth side are parallel to the extending direction of the data line segment; and the fifth side is parallel to the extending direction of the side edge of the protrusive structure close to the pixel electrode.

2. The array substrate according to claim 1, wherein, $70°≤α≤85°$ and $30°≤β≤50°$.

3. The array substrate according to claim 1, further comprising a common electrode, which is provided above and insulated from the pixel electrode; the common electrode is provided with slits whose extending direction is parallel to the extending direction of the data line segment.

4. The array substrate according to claim 1, wherein, a source of the thin film transistor is the connection portion, or a part of the connection portion.

5. The array substrate according to claim 1, wherein, the extending directions of the data line segments, corresponding to different pixel units, of the same data line are parallel to each other.

6. The array substrate according to claim 1, wherein, the connection portion is curved.

7. The array substrate according to claim 1, wherein, a drain of the thin film transistor and the pixel electrode are connected through a via in a passivation layer, or lapped directly.

8. A display device, comprising an array substrate and an opposite substrate assembled with the array substrate in an aligned manner, wherein, the array substrate is the array substrate according to claim 1.

9. A manufacturing method of an array substrate, comprising the following steps of:

S1: forming gates of thin film transistors, gate lines and common electrode lines on a substrate, such that each gate is a protrusive structure of the gate line;

S2: forming a gate insulation layer on the substrate subjected to step S1;

S3: forming an active layer of the thin film transistor on the substrate subjected to step S2;

S4: forming a source and a drain of the thin film transistor, and data lines on the substrate subjected to step S3, such that an included angle between extending direction of the gate line and extending direction of the data line is a, where 60o<a<87°, and each data line comprises a plurality of data line segments, each of which corresponds to one pixel unit, and two adjacent data line segments of the same data hue are connected through a connection portion;

S5: forming a passivation layer on the substrate subjected to step S4, and forming a via penetrating through the passivation layer above the drain of the thin film transistor; and S6: forming a pixel electrode on the substrate subjected to step S5, such that the pixel electrode is connected to the drain through the via, and an included angle between extending direction of a side edge of the protrusive structure close to the pixel electrode and the extending direction of the gate line is p, where 20°<P<70°, and wherein, the pixel electrode is a plate-like electrode, which in a plan view comprises a first side, a second side, a third side, a fourth side and a fifth side; the first side and the second side are parallel to the extending direction of the gate line; the third side and the fourth side are parallel to the extending direction of the data line segment; and the fifth side is parallel to the extending direction of the side edge of the protrusive structure close to the pixel electrode, and wherein, for each pixel unit, in a plan view, an outer side edge of the protrusive structure of the gate line is located at a side of the data line opposite to the pixel electrode and the connection portion is located within the protrusive structure.

10. The manufacturing method according to claim 9, wherein, $70° \leq \alpha \leq 85°$ and $30° \leq \beta \leq 50°$.

11. A manufacturing method of an array substrate, comprising the following steps of:

A1: forming gates of thin film transistors, gate lines and common electrode lines on a substrate, such that each gate is a protrusive structure of the gate line;

A2: forming a gate insulation layer on the substrate subjected to step A1;

A3: forming a pixel electrode on the substrate subjected to step A2, such that an included angle between extending direction of a side edge of the protrusive structure close to the pixel electrode and extending direction of the gate line is beta, where 20°<beta<70°, A4: forming an active layer of the thin film transistor on the substrate subjected to step A3;

A5: forming a source and a drain of the thin film transistor, and data lines on the substrate subjected to step A4, such that the drain and the pixel electrode are lapped directly and an included angle between the extending direction of the gate line and extending direction of the data line is alpha, where 60°<alpha<87°, and each data line comprises a plurality of data line segments, each of which corresponds to one pixel unit, and two adjacent data line segments of the same data line are connected through a connection portion;

A6: forming a passivation layer on the substrate subjected to step A5; and

A7: forming a common electrode on the substrate subjected to step A6, such that the common electrode is provided above and insulated from the pixel electrode, and the common electrode is provided with slits, whose extending direction is parallel to the extending direction of the data line, and the pixel electrode is a plate-like electrode, which in a plan view comprises a first side, a second side, a third side, a fourth side and a fifth side; the first side and the second side are parallel to the extending direction of the gate line; the third side and the fourth side are parallel to the extending direction of the data line segment; and the fifth side is parallel to the extending direction of the side edge of the protrusive structure close to the pixel electrode;

wherein, for each pixel unit, in a plan view, an outer side edge of the protrusive structure of the gate line is located at a side of the data line opposite to the pixel electrode and the connection portion is located within the protrusive structure.

12. The manufacturing method according to claim 11, wherein, $70° \leq \alpha \leq 85°$ and $30° \leq \beta \leq 50°$.

13. A display device, comprising an array substrate and an opposite substrate assembled with the array substrate in an aligned manner, wherein, the array substrate is the array substrate according to claim 2.

14. A display device, comprising an array substrate and an opposite substrate assembled with the array substrate in an aligned manner, wherein, the array substrate is the array substrate according to claim 1.

15. A display device, comprising an array substrate and an opposite substrate assembled with the array substrate in an aligned manner, wherein, the array substrate is the array substrate according to claim 3.

16. A display device, comprising an array substrate and an opposite substrate assembled with the array substrate in an aligned manner, wherein, the array substrate is the array substrate according to claim 4.

17. A display device, comprising an array substrate and an opposite substrate assembled with the array substrate in an aligned manner, wherein, the array substrate is the array substrate according to claim 5.

18. The array substrate according to claim 1, wherein, for each pixel unit, in a plan view, the protrusive structure of the gate line has an edge intersecting with the data line segment.

19. A display device, comprising an array substrate and an opposite substrate assembled with the array substrate in an aligned manner, wherein, the array substrate is the array substrate according to claim 1.

* * * * *